United States Patent
Yamada et al.

(10) Patent No.: US 7,232,618 B2
(45) Date of Patent: Jun. 19, 2007

(54) ORGANIC LIGHT-EMITTING DEVICE

(75) Inventors: Naoki Yamada, Tokyo (JP); Kazunori Ueno, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 484 days.

(21) Appl. No.: 10/507,476

(22) PCT Filed: Apr. 9, 2003

(86) PCT No.: PCT/JP03/04483

§ 371 (c)(1),
(2), (4) Date: Sep. 13, 2004

(87) PCT Pub. No.: WO03/087258

PCT Pub. Date: Oct. 23, 2003

(65) Prior Publication Data

US 2006/0035108 A1    Feb. 16, 2006

(30) Foreign Application Priority Data

Apr. 12, 2002   (JP)   ............... 2002-109939

(51) Int. Cl.
*H01L 51/54* (2006.01)
*C09K 11/06* (2006.01)

(52) U.S. Cl. .................. 428/690; 428/917; 313/504; 257/E51.044

(58) Field of Classification Search ............ None
See application file for complete search history.

(56) References Cited

U.S. PATENT DOCUMENTS

| | | | |
|---|---|---|---|
| 4,539,507 A | 9/1985 | Van Slyke et al. | 313/504 |
| 4,720,432 A | 1/1988 | Van Slyke et al. | 428/457 |
| 4,885,211 A | 12/1989 | Tang et al. | 428/457 |
| 5,130,603 A | 7/1992 | Tokailin et al. | 313/504 |
| 5,151,629 A | 9/1992 | Van Slyke | 313/504 |
| 5,227,252 A | 7/1993 | Murayama et al. | 428/690 |
| 5,247,190 A | 9/1993 | Friend et al. | 257/40 |
| 5,317,169 A | 5/1994 | Nakano et al. | 257/40 |
| 5,382,477 A | 1/1995 | Saito et al. | 428/690 |
| 5,409,783 A | 4/1995 | Tang et al. | 428/690 |
| 5,514,878 A | 5/1996 | Holmes et al. | 257/40 |
| 5,672,678 A | 9/1997 | Holmes et al. | 528/373 |
| 5,726,457 A | 3/1998 | Nakano et al. | 257/40 |
| 5,935,720 A | 8/1999 | Chen et al. | 428/690 |
| 6,093,864 A | 7/2000 | Tokailin et al. | 585/25 |
| 6,652,997 B2 | 11/2003 | Suzuki et al. | 428/690 |
| 6,780,528 B2 | 8/2004 | Tsuboyama et al. | 428/690 |
| 2001/0051487 A1 | 12/2001 | Hashimoto et al. | 445/24 |
| 2003/0232216 A1 | 12/2003 | Saitoh et al. | 428/690 |
| 2003/0235713 A1 | 12/2003 | Suzuki et al. | 428/690 |

FOREIGN PATENT DOCUMENTS

| | | |
|---|---|---|
| EP | 1 191 614 A2 | 3/2002 |
| JP | 05-202356 | 8/1993 |
| JP | 05-247460 | 9/1993 |
| JP | 09-202878 | 8/1997 |
| JP | 09-227576 | 9/1997 |
| JP | 2001-257076 | 9/2001 |
| JP | 2002-050483 | 2/2002 |
| JP | 2002-062824 | 2/2002 |
| JP | 2002-175884 | 6/2002 |
| WO | WO 00/57676 | 9/2000 |
| WO | WO 02/094965 | 11/2002 |
| WO | WO 03/017730 | 2/2003 |
| WO | WO 2005/097940 A1 * | 10/2005 |

OTHER PUBLICATIONS

Burroughes et al., "Light-emitting diodes based on conjugated polymers"; Nature, vol. 347, 539-541 (1990).
Tang et al., "Organic Electroluminescent diodes"; Appl. Phys., Lett.; vol. 51, No. 12, pp. 913-915 (1987).

* cited by examiner

*Primary Examiner*—Marie Yamnitzky
(74) *Attorney, Agent, or Firm*—Fitzpatrick, Cella, Harper & Scinto

(57) ABSTRACT

An organic light-emitting device that exhibits a light emission of extremely high efficiency, high brightness, and long lifetime is provided. An organic light-emitting device includes a pair of electrodes including an anode and a cathode, and one or more layers containing an organic compound, the layers being sandwiched between the pair of the electrodes, characterized in that at least one layer of the layers containing an organic compound contains a compound represented by the following general formula (1)

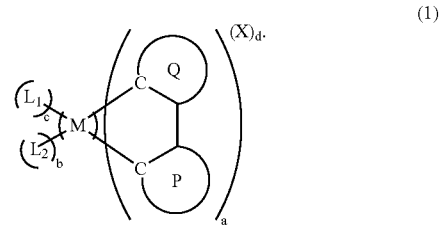

2 Claims, 2 Drawing Sheets

ORGANIC LIGHT-EMITTING DEVICE

TECHNICAL FIELD

The present invention relates to an organic light-emitting device, and more specifically to a device that emits light by applying an electric field to a thin film containing an organic compound.

BACKGROUND ART

Organic light-emitting devices are luminescent devices utilizing light that is emitted when excitons of fluorescent organic compounds move back to the ground state, the excitons being formed by sandwiching a thin film that contains the fluorescent compounds between an anode and a cathode and injecting electrons and holes (positive holes) from the respective electrodes.

A study by Eastman Kodak Company in 1987 (Appl. Phys. Lett. 51, 913 (1987)) reports that a light emission of about 1000 cd/m$^2$ was observed under an applied voltage of about 10 V. In the study, the device had a function-separated type bilayer structure and used ITO as the anode, a magnesium-silver alloy as the cathode, an aluminum quinolinol complex as an electron-transporting material and a light-emitting material, and a triphenylamine derivative as a hole-transporting material. Related patent documents include U.S. Pat. No. 4,539,507, No. 4,720,432, and No. 4,885,211, etc.

Moreover, various light emissions in a range of from ultraviolet to infrared can be accomplished by using various different fluorescent organic compounds. Recently, a lot of studies on various compounds have been conducted actively. For instance, those studies are disclosed in U.S. Pat. No. 5,151,629, No. 5,409,783, No. 5,382,477, No. 5,130,603, No. 6,093,864, No. 5,227,252, Japanese Patent Applications Laid-Open No. 5-202356, No. 9-202878, and No. 9-227576.

In addition to the organic light-emitting devices using small molecular materials as described above, the organic light-emitting devices using conjugated polymers have been reported by the group of Cambridge University (Nature, 347, 539 (1990)). This report discloses that a film of polyphenylenevinylene (PPV) is formed by coating method and it is surely observed that a single layer of the film emitted light. Related patent documents on organic light-emitting devices using conjugated polymers include U.S. Pat. No. 5,247,190, No. 5,514,878, No. 5,672,678, No. 5,317,169, No. 5,726,457, and Japanese Patent Application Laid-Open No. 5-247460, etc.

Thus the remarkable progresses have been made in organic light-emitting devices, so that the recent luminescent devices are characterized by high brightness even when a lower voltage is applied, diversity in emission wavelengths, and rapid response, and thin and lightweight luminescent devices can be obtained, which suggests a wide range of possibilities of the device being utilized for various uses.

However, under the present circumstances, light emissions exhibiting higher brightness or higher conversion efficiency are required. Furthermore, there are still many problems in regard to durability such as change with elapse of time due to prolonged use and deterioration or the like, by moisture and the atmospheric gas containing oxygen. Moreover, in view of application to a full-color display etc., blue, green, and red light emissions having higher color purities are needed, and this problem has not been solved sufficiently yet.

SUMMARY OF THE INVENTION

The present invention has been made to solve the above-mentioned problems of the conventional technologies, and an object of the present invention is to provide an organic light-emitting device that exhibits a light emission of extremely high efficiency, high brightness, and long lifetime.

Furthermore, another object of the present invention is to provide an organic light-emitting device that shows various emission wavelengths and various emission hues and that is extremely durable.

Moreover, another object of the present invention is to provide an organic light-emitting device that can not only be manufactured easily but also produced at a relatively low cost.

The inventors of the present invention made intensive investigations to solve the above-mentioned problems. As a result, they have found out that an organic light-emitting device exhibiting a light emission of higher efficiency and higher brightness can be produced by use of an organic light-emitting device including a pair of electrodes including an anode and a cathode, and one or more layers containing an organic compound, the layers being sandwiched between the pair of the electrodes, in which at least one layer of the layers containing an organic compound contains a specific compound, thereby completing the present invention.

According to the present invention, there is provided an organic light-emitting device including a pair of electrodes including an anode and a cathode, and one or more layers containing an organic compound, the layers being sandwiched between the pair of the electrodes, in which at least one layer of the layers containing an organic compound contains a compound represented by the following general formula (1).

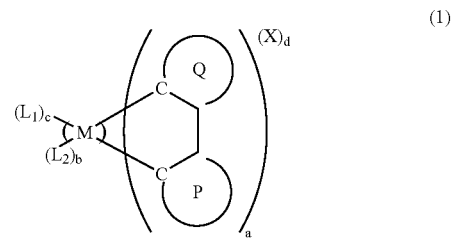

(1)

(In the formula, M is a metal atom, preferably an iridium atom or a platinum atom; P and Q each are a substituted or unsubstituted aromatic hydrocarbon group or a substituted or unsubstituted aromatic heterocyclic group; and P and Q constitute a chelate ligand; P and Q may form a condensed ring with each other; $L_1$ and $L_2$ each are a ligand or an oxygen atom that binds to M by a double bond; $L_1$ and $L_2$ may form a condensed ring with each other to become a two-coordinate chelate ligand; X represents a counter ion of an anion or a cation; a is an integer of 1 to 3; b and c each are an integer of 0 to 4; and d is an integer of 0 to 3, provided that P, Q, $L_1$, $L_2$, and X each may be the same or different if there are more than one of these).

In the organic light-emitting device of the present invention, the metal atom M preferably is a five-coordinate 16-electron bonding system or a six-coordinate 18-electron bonding system with $L_1$ and $L_2$ and with a chelate ligand comprising P and Q.

BEST MODES FOR CARRYING OUT THE INVENTION

Figure 1:
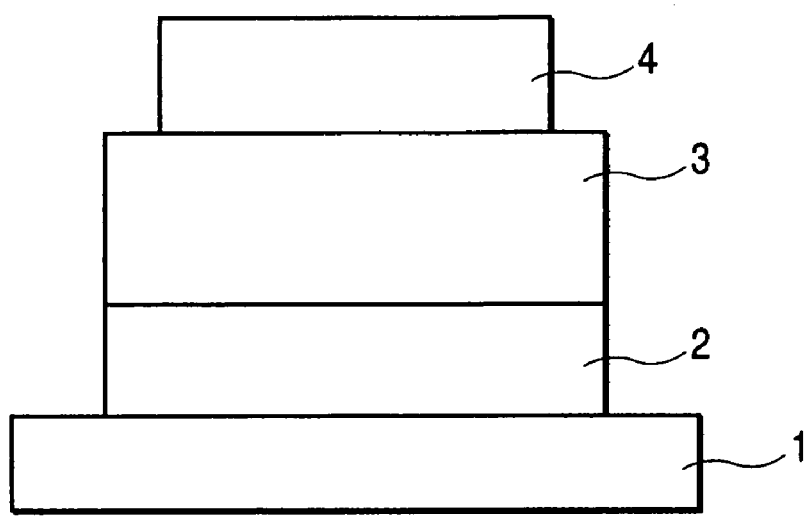
FIG. 1 is a sectional view showing an example of an organic light-emitting device of the present invention.

Hereinafter, the present invention will be explained in detail.

First, the compounds represented by the above-mentioned general formula (1) for use in the present invention will be explained.

Examples of the metal M in the general formula (1) include Pd(II), Pt(II), Ru(II)CO, Zn(II), Mg(II), Sn(IV), Pb(II), Al, Cd, Si(IV), Ge(IV), Ba, Sr, Be, Sc(III), Ti(IV), Zr(IV), Hf(IV), Nb(V), Ta(V), Co(III), Rh(III), Ir(III), Ir(IV), Ni(II), VO, Sn(II), Ru(II), Ru(III), Cu(II), Ag, Co(II), Ca, Hg, Mn(II), Fe(II), Fe(III), and the like, but are not limited to the above-mentioned metal and a general metal atom may be used.

Further, specific examples of P and Q that constitute a chelate ligand will be shown hereinbelow.

The substituted or unsubstituted aromatic hydrocarbon group includes a phenyl group, a 4-methylphenyl group, a 4-ethylphenyl group, a 3-chlorophenyl group, a 3,5-dimethylphenyl group, a triphenylamino group, a biphenyl group, a terphenyl group, a naphthyl group, an anthryl group, a phenanthryl group, a pyrenyl group, a tolyl group, a tosyl group, a halogen-substituted naphthyl group, and the like.

The substituted or unsubstituted aromatic heterocyclic group includes: five-membered heterocyclic rings such as a thienyl group, a furyl group, a pyrrolyl group, an imidazolyl group, a pyrazolyl group, an isothiazolyl group, and an isoxazolyl group; six-membered heterocyclic rings such as a pyranyl group, a pyridyl group, a pyrazinyl group, a pyrimidinyl group, and a pyridazinyl group; and a bipyridyl group, a methylpyridyl group, a terthienyl group, a propylthienyl group, an isobenzofuranyl group, an indolizinyl group, an isoindolyl group, an indolyl group, an indazolyl group, a purinyl group, an indolinyl group, an isoindolinyl group, a chromenyl group, a quinolizinyl group, an isoquinolyl group, a quinolyl group, a phthalazinyl group, a naphthylidinyl group, a quinazolinyl group, a carbazolyl group, an N-ethylcarbazolyl group, a thianthrenyl group, phenanthridinyl group, a perimidinyl group, etc.

The condensed ring that P and Q forms include a benzo ring, a naphtho ring, an anthra ring, an acenaphtho ring, and the like. It may also include heterocyclic rings such as those whose names begin with furo-, imidazo-, pyrido-, quino-, thieno-, and the like.

In addition, the substituents that P and Q may have include but are of course not limited to: alkyl groups or aralkyl groups such as a methyl group, an ethyl group, an n-propyl group, an iso-propyl group, a tert-butyl group, an octyl group, a benzyl group, and a phenethyl group; alkenyl groups such as a vinyl group, an allyl group (a 2-propenyl group), a 1-propenyl group, an iso-propenyl group, and a 2-butenyl group; alkoxy groups such as a methoxy group, an ethoxy group, a propoxy group, a 2-ethyloctyloxy group, a phenoxy group, a 4-butylphenoxy group, and a benzyloxy group; carbonyl groups such as an acetyl group, a propionyl group, an isobutyryl group, a methacryloyl group, a benzoyl group, a naphthoyl group, an anthroyl group, and a toluoyl group; amino groups such as a methylamino group, an ethylamino group, a dimethylamino group, a diethylamino group, a methylethylamino group, a benzylamino group, a methylbenzylamino group, an anilino group, a diphenylamino group, a phenyltolylamino group, and a ditolylamino group; a halogen; an azo group; those aryl groups, heterocyclic groups, or condensated rings described above; and the like.

Also, specific examples of the ligands $L_1$ and $L_2$ include alkoxy groups such as a methoxy group, an ethoxy group, a propoxy group, a 2-ethyloctyloxy group, a phenoxy group, a 4-butylphenoxy group, and a benzyloxy group.

In addition, it may include aryl groups such as a phenyl group, a 4-methylphenyl group, a 4-ethylphenyl group, a 3-chlorophenyl group, a 3,5-dimethylphenyl group, a triphenylamino group, a biphenyl group, a terphenyl group, a naphthyl group, an anthryl group, a phenanthryl group, a pyrenyl group, a tolyl group, a tosyl group, a halogen-substituted naphthyl group, and the like.

Further, it may include: five-membered heterocyclic rings such as a thienyl group, a furyl group, a pyrrolyl group, an imidazolyl group, a pyrazolyl group, an isothiazolyl group, and an isoxazolyl group; six-membered heterocyclic rings such as a pyranyl group, a pyridyl group, a pyrazinyl group, a pyrimidinyl group, and a pyridazinyl group; and heterocyclic groups such as a bipyridyl group, a methylpyridyl group, a terthienyl group, a propylthienyl group, an isobenzofuranyl group, an indolizinyl group, an isoindolyl group, an indolyl group, an indazolyl group, a purinyl group, an indolinyl group, an isoindolinyl group, a chromenyl group, a quinolizinyl group, an isoquinolyl group, a quinolyl group, a phthalazinyl group, a naphthylidinyl group, a quinazolinyl group, a carbazolyl group, an N-ethylcarbazolyl group, a thianthrenyl group, phenanthridinyl group, a perimidinyl group, etc.

Furthermore, it may include phosphino groups such as a triphenylphosphino group, a trimethylphosphino group, and a triethylphosphino group.

Additionally, it may also include amino groups such as a methylamino group, an ethylamino group, a dimethylamino group, a diethylamino group, a methyethylamino group, a benzylamino group, a methylbenzylamino group, an anilino group, a diphenylamino group, a phenyltolylamino group, and a ditolylamino group.

Moreover, azo groups that were formed by optionally combining the above-mentioned substituents may be used.

For the condensed rings that $L_1$ and $L_2$ form, a benzo ring, a naphtho ring, an anthra rings, an acenaphto ring, and the like may be used. It may also include heterocyclic rings such as those whose names begin with furo-, imidazo-, pyrido-, quino-, thieno-, and the like.

Also, $L_1$ and $L_2$ may have substituents, and those substituents include, but of course are not limited to, the above-mentioned alkoxy groups, heterocyclic groups, phosphino groups, amino groups, halogen groups, azo groups, condensed rings, and the like.

As the counter ion X, there may be mentioned anionic ones in which case examples thereof include $F^-$, $Cl^-$, $Br^-$, $O_2^-$, $(O_2)^{2-}$, $(O_2)^-$, $(OH)^-$, $(SH)^-$, $(SO_4)^{2-}$, $NH_2^-$, $N^{3-}$, $(CN)^-$, $(NCO)^-$, $(NCS)^-$, $(NO_2)^-$, $(OAc)^-$, $(ClO_4)^-$, $(SbO_4)^-$, $(Im)^-$, $(BF_4)^-$, etc., and cationic ones in which case examples thereof include K⁺, Na⁺, NH$_4^+$, Li⁺, etc., but are not limited to the above-mentioned ion and general counter ions may be used therefor.
Next, representative examples of the compound represented by the general formula (1) will be mentioned. However, the compounds are not limited to the following exemplified compounds.
1
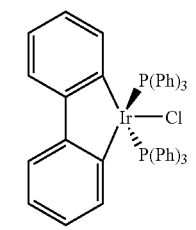
2
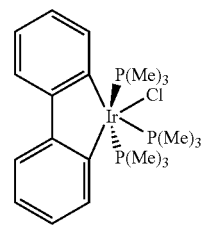
3
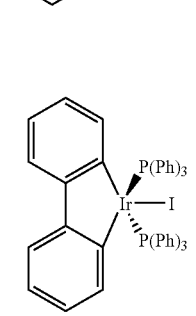
4
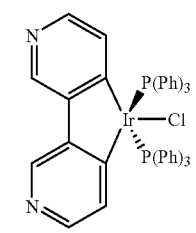
5
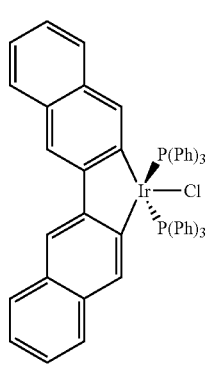
-continued
6
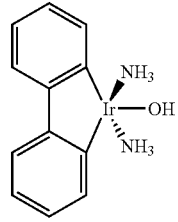
7
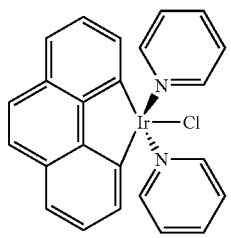
8
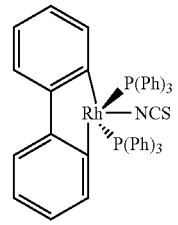
9
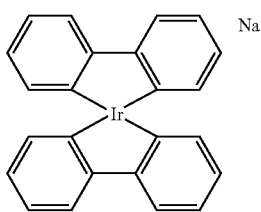
10
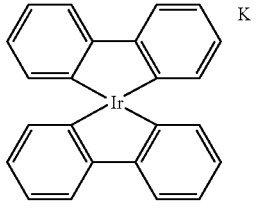
11
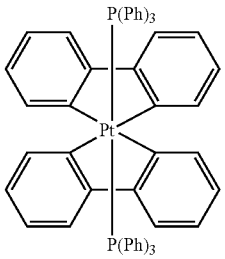
12
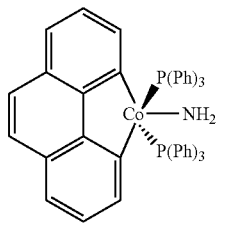

-continued

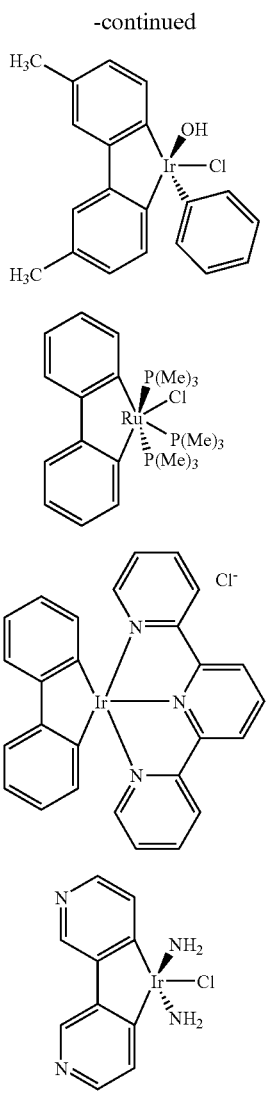

Next, the organic light-emitting devices of the present invention will be explained with reference to the figures.

FIG. 1 is a sectional view showing an example of an organic light-emitting device of the present invention. FIG. 1 shows a structure having a substrate 1 on which an anode 2, an emission layer 3, and a cathode 4 are provided in this order. This light-emitting device is useful in the case of a device independently having hole-transporting ability, electron-transporting ability, and light-emitting ability in itself or the case of a device using a mixture of the compounds having the respective characteristics.

Figure 2:
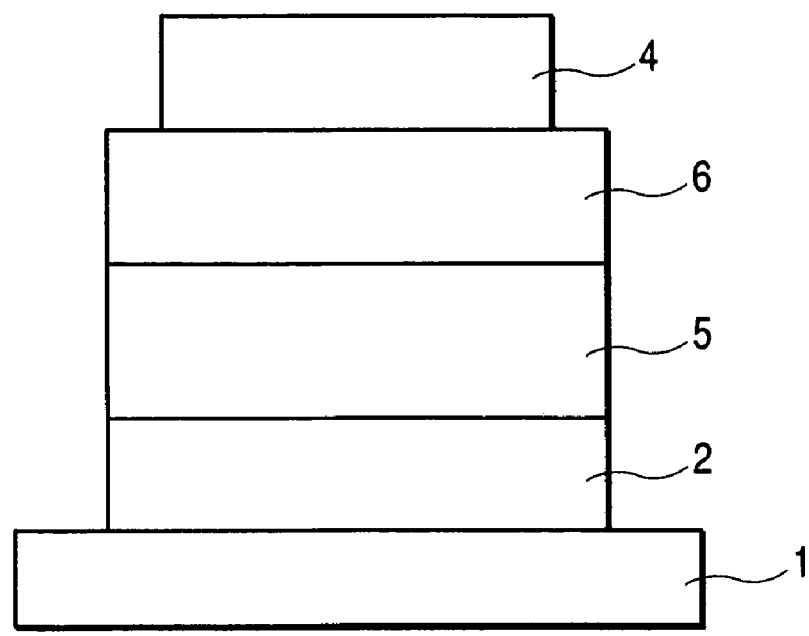
FIG. 2 is a sectional view showing another example of an organic light-emitting device of the present invention.

FIG. 2 is a sectional view showing another example of an organic light-emitting device of the present invention. FIG. 2 shows a structure having a substrate 1 on which an anode 2, a hole-transporting layer 5, an electron-transporting layer 6, and a cathode 4 are provided in this order. This structure is useful in the case of using either a hole-transporting material or an electron-transporting material or a material that have both hole-transporting ability and electron-transporting ability in the respective layers and using a light-emitting material in combination with a mere hole-transporting material or a mere electron-transporting material having no light-emitting ability. In addition, this structure contains a light-emitting layer including either a hole-transporting layer 5 or an electron-transporting layer 6.

Figure 3:
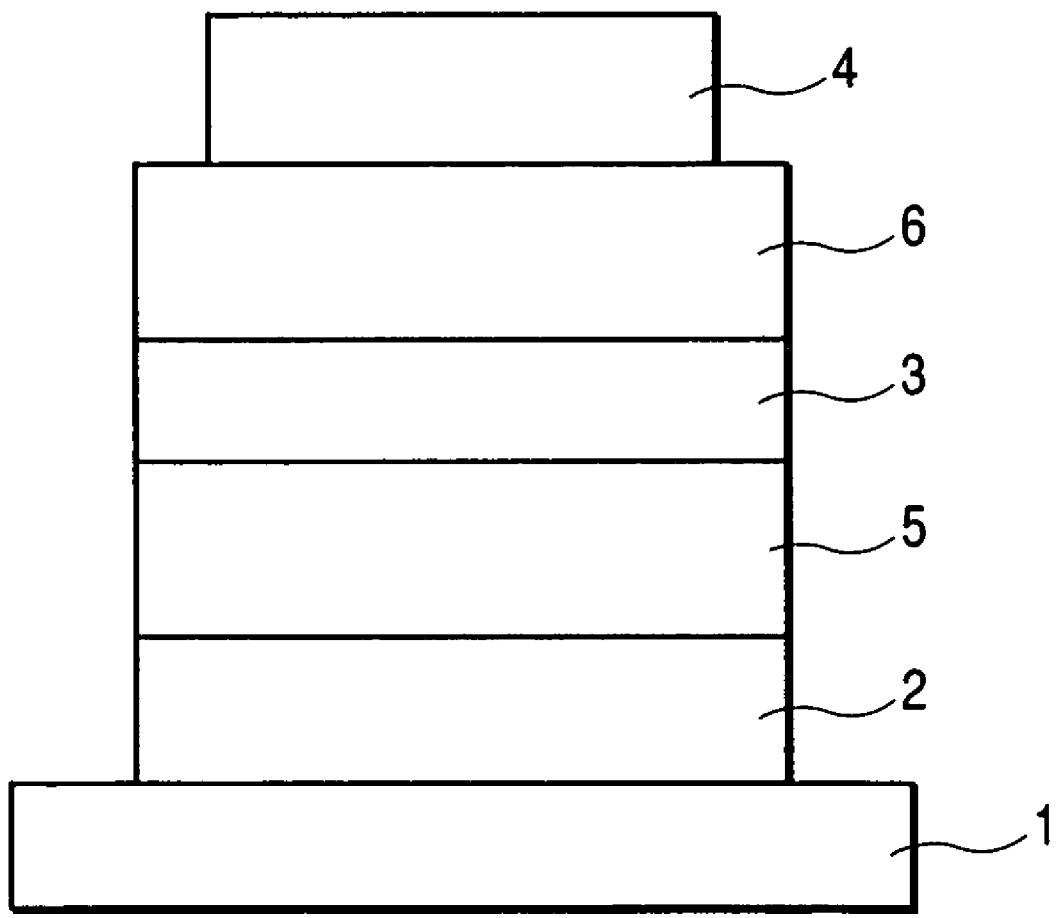
FIG. 3 is a sectional view showing still another example of an organic light-emitting device of the present invention.

FIG. 3 is a sectional view showing another example of an organic light-emitting device of the present invention. FIG. 3 shows a structure having a substrate 1 on which an anode 2, a hole-transporting layer 5, a light-emitting layer 3, an electron-transporting layer 6, and a cathode 4 are provided in this order. In this case, carrier transfer function and light emission function are separated. This case is employed appropriately in combination with the respective compounds having hole-transporting ability, electron-transporting ability, and light-emitting ability, respectively. This case, therefore, enables not only extremely increased freedom of selection of materials but also diversity of luminescent hue because various compounds that have different emission wavelengths from each other can be used. Moreover, it is also possible to improve emission efficiency because the respective carriers or excitons are enclosed effectively in the central light-emitting layer 3.

However, FIGS. 1 to 3 merely show very basic device structures, to which structures of the organic light-emitting devices using the compounds of the present invention are not limited. For example, various layer structures can be prepared, such as by providing an insulating layer in the interface between an electrode and an organic layer, providing an adhesion layer or an interfering layer, and preparing a hole-transporting layer including two layers having different ionization potentials to each other, etc.

The compounds represented by the general formula (1) used in the present invention are excellent in electron-injecting ability, electron-transporting ability, and light-emitting ability compared with conventional compounds, and can be used in any form as in FIGS. 1 to 3.

In particular, an organic layer containing a compound represented by the general formula (1) of the present invention is useful as an electron-transporting layer and also as a light-emitting layer.

In the organic light-emitting devices of the present invention, a compound represented by the general formula (1) is made into an organic layer between an anode 2 and a cathode 4 by vacuum vapor deposition method or solution coating method. The thickness of the organic layer is less than 10 μm, and is preferably thinned to a thickness of 0.5 μm or less, more preferably 0.01 to 0.5 μm.

In the present invention, a compound represented by the above-mentioned general formula (1) is used as a component for constituting an electron-transporting layer or a light-emitting layer but additionally, hole-transporting compounds, light-emitting compounds, light-emitting layer matrix compounds, electron-transporting compounds, charge-transporting polymer materials, and light-emitting polymer materials that have already been known (such as the following compounds) can be used together if necessary. However, such compounds for use in the present invention are not limited to these compounds.

Hole-transporting compounds

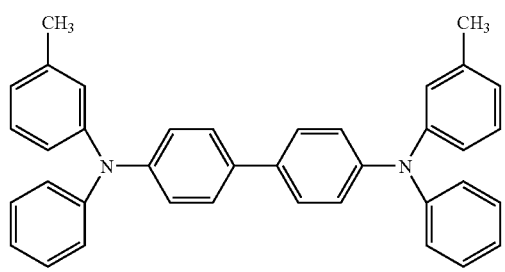

TPD

-continued
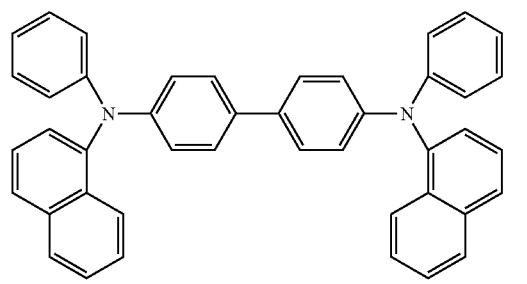
α-NPD
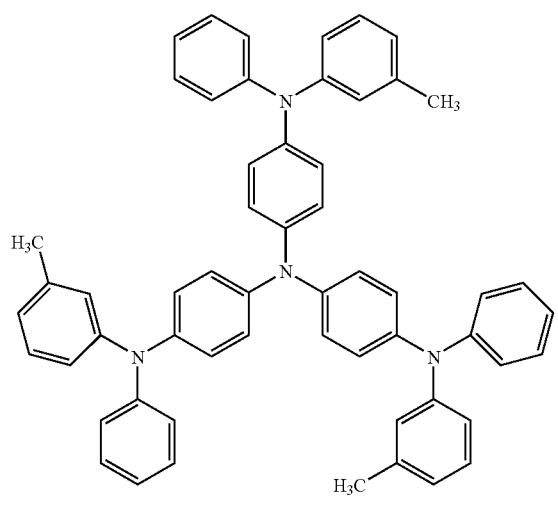
m-MTDATA
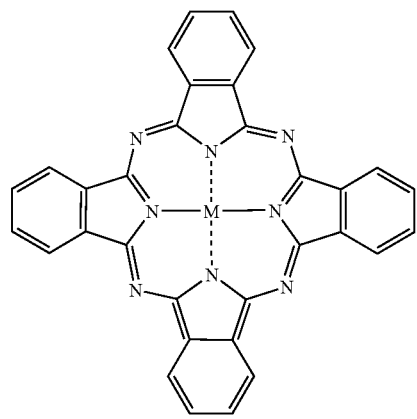
Pc—M
M: Cu, Mg, AlCl, TiO, SiCl₂, Zn, Sn, MnCl, GaCl, etc
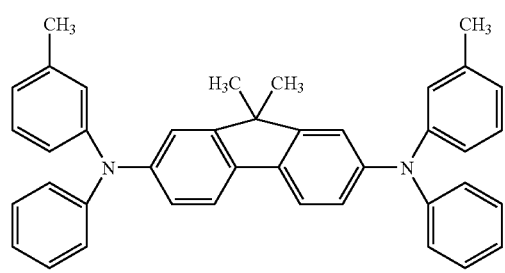
DTDPFL
-continued
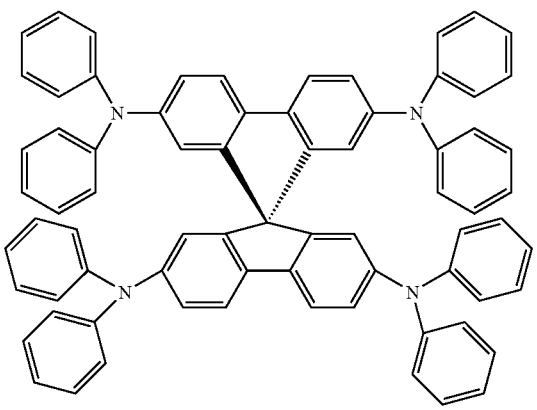
spiro-TPD
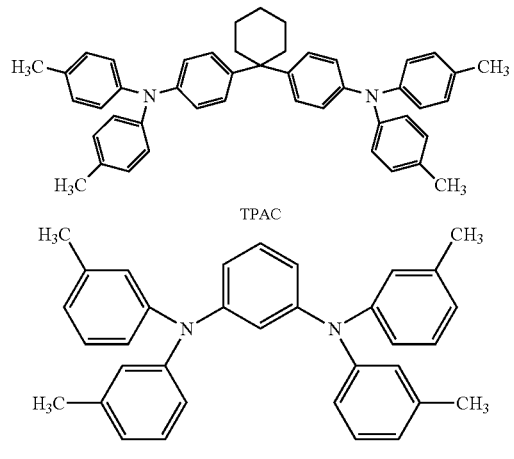
TPAC
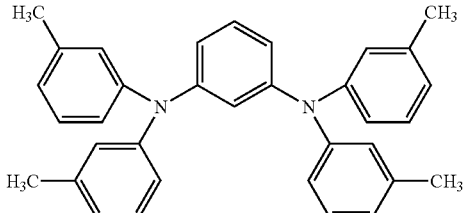
PDA
Electron-transporting light-emitting materials
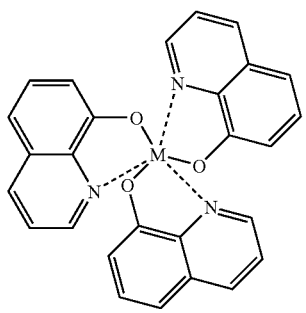
M: Al, Ga
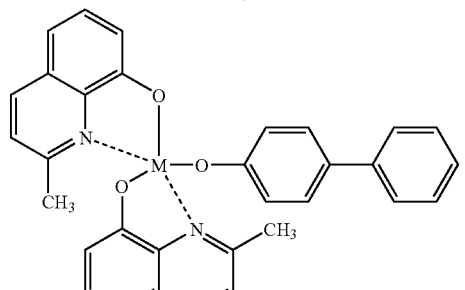
M: Al, Ga -continued
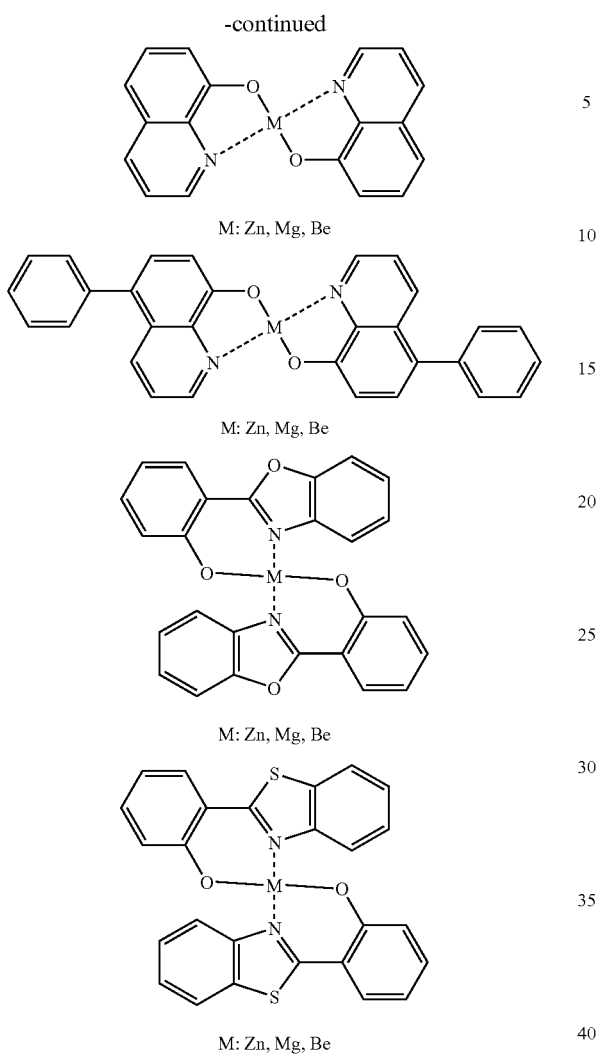
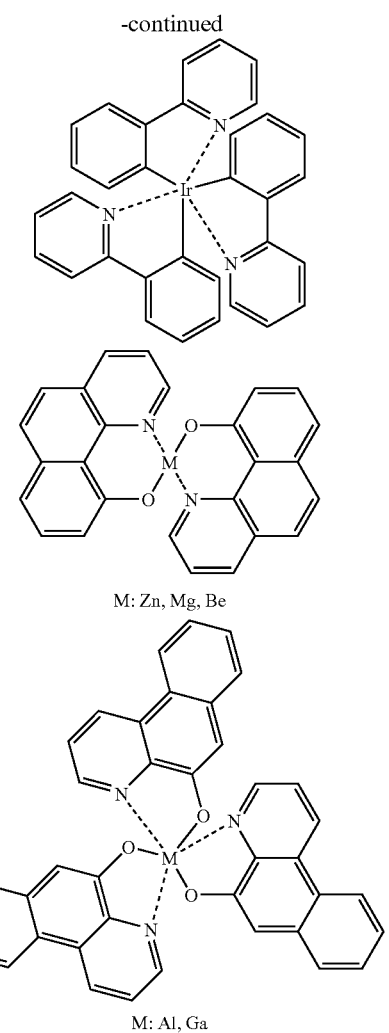
Light-emitting materials
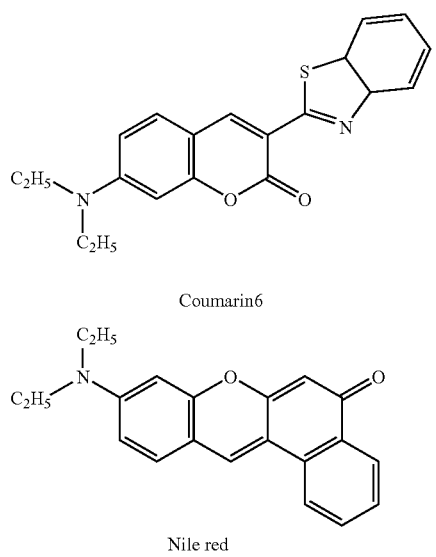
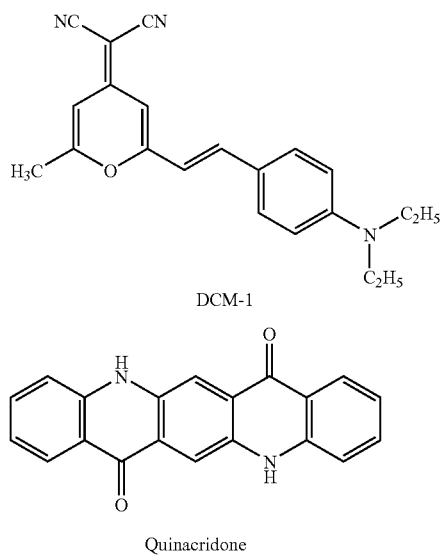

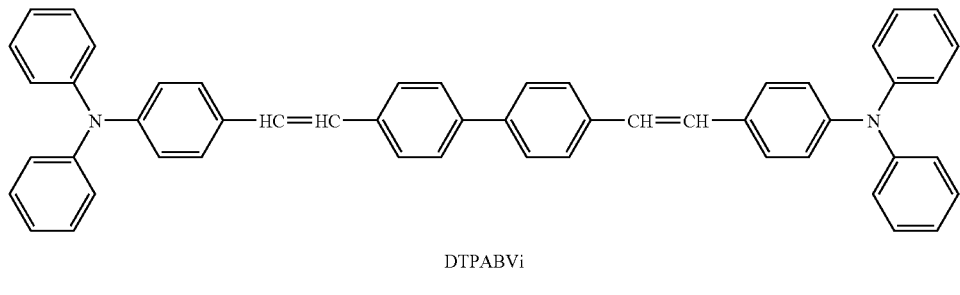
DTPABVi
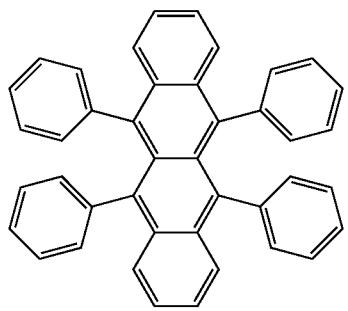
Rubrene
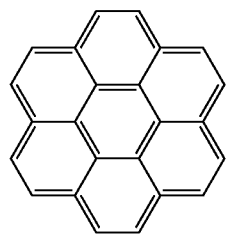
Coronene
Light-emitting layer matrix materials and electron-transporting materials
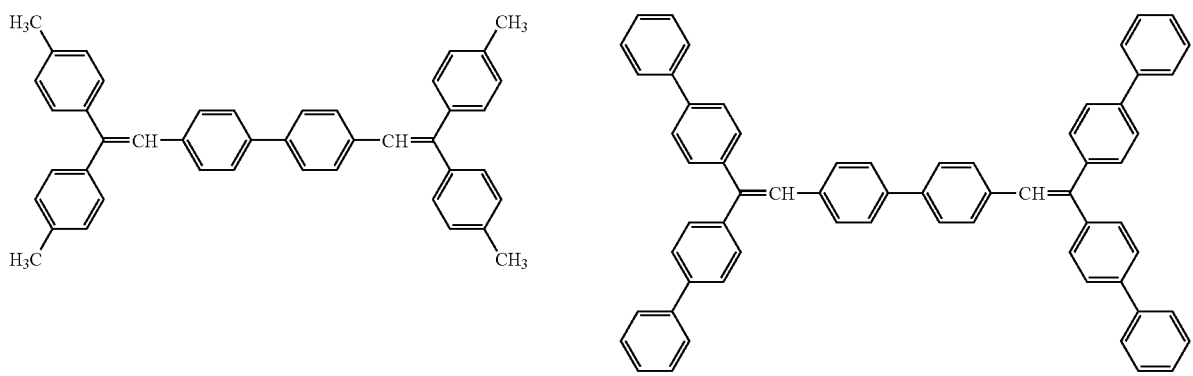
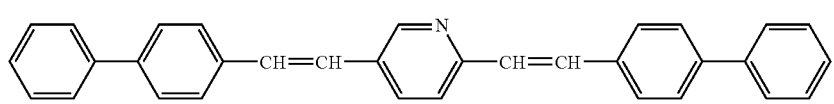

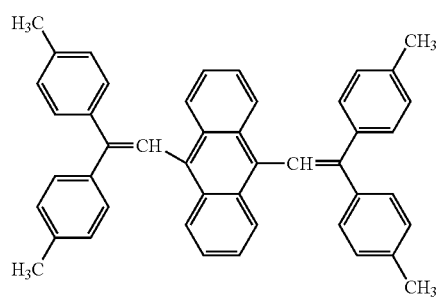
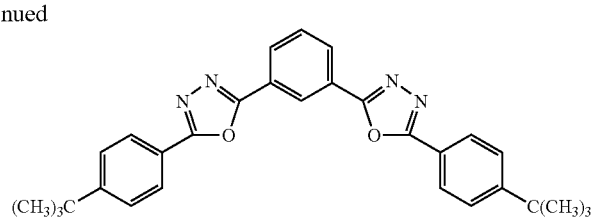
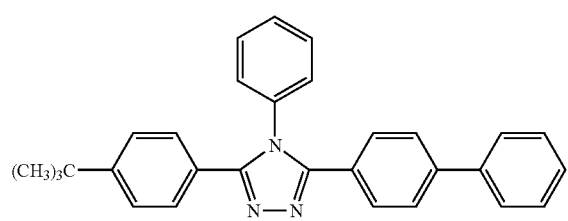
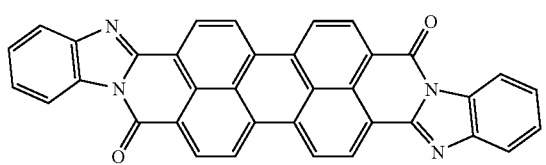
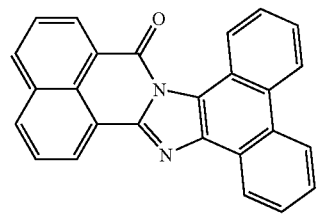
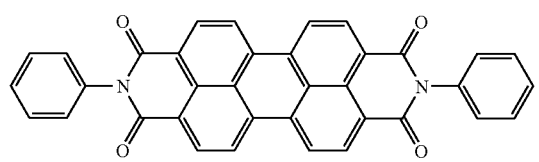
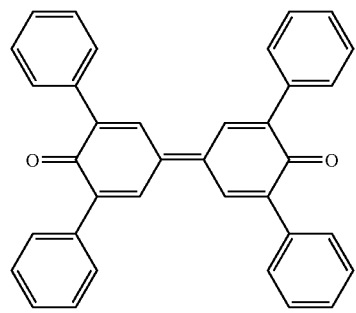
Polymeric hole-transporting materials
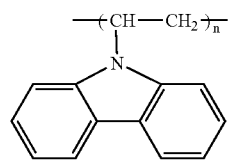
PVCz
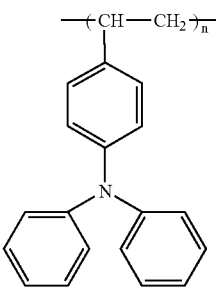
DPA-PS -continued
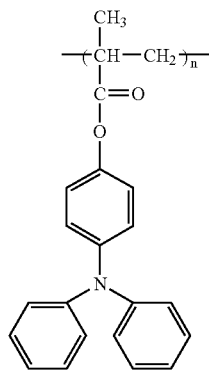
TPA-PMMA
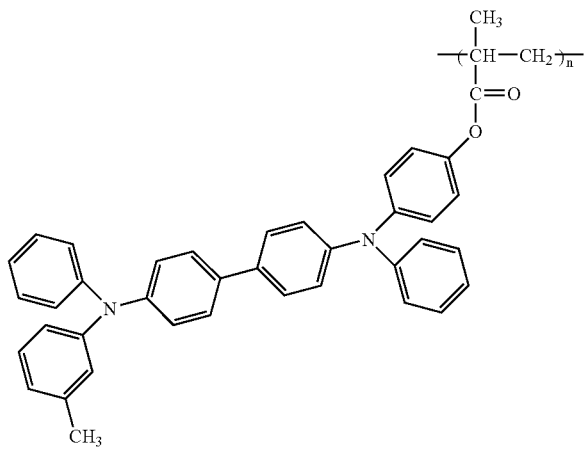
TPD-PMAA
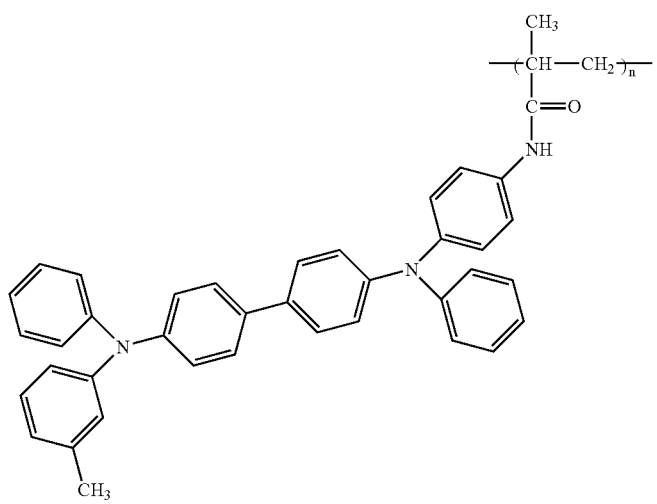
TPD-PMAA
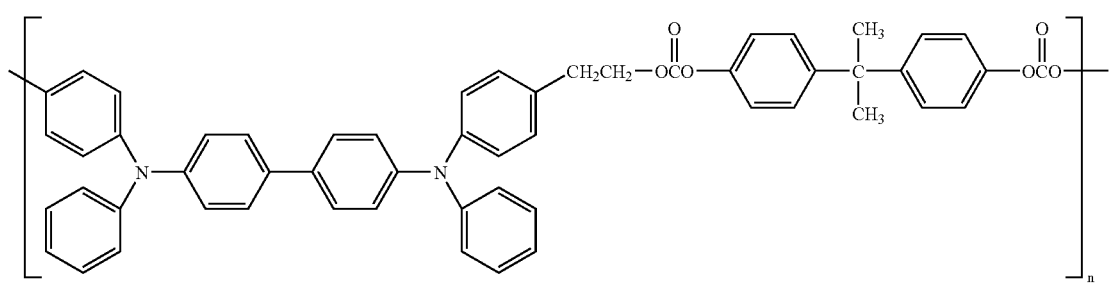
TPD-PCA

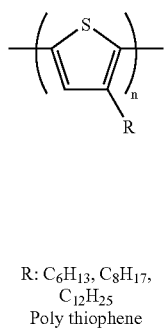

R: $C_6H_{13}$, $C_8H_{17}$, $C_{12}H_{25}$
Poly thiophene

-continued

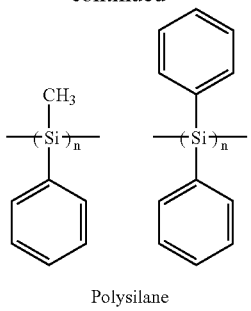

Polysilane

Polymeric light-emitting materials and charge-transporting materials

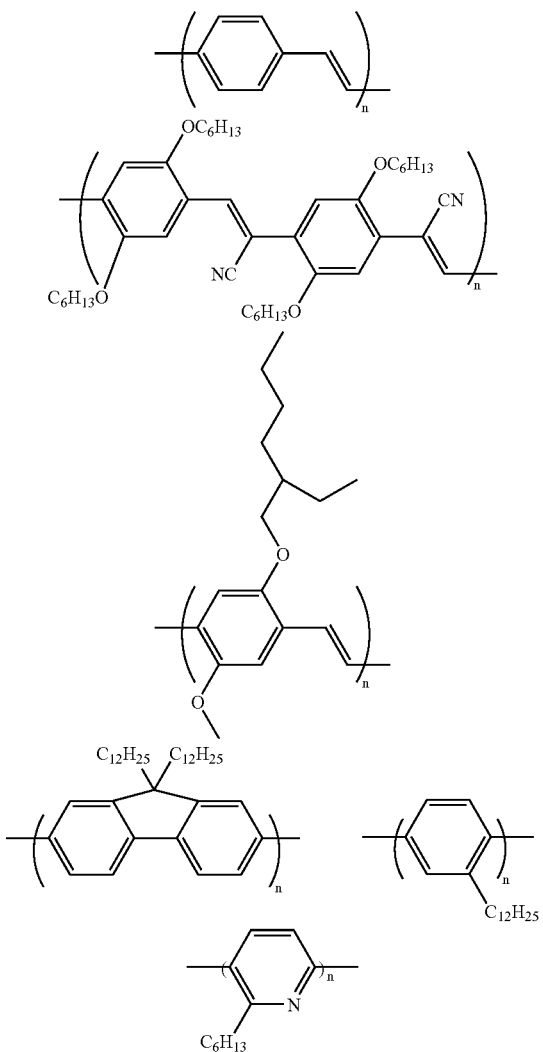

In the organic light-emitting devices of the present invention, a layer containing the compounds represented by the general formula (1) and a layer containing other organic compounds can be made into a thin film generally by vacuum vapor deposition method or by coating method after the compounds are dissolved in an appropriate solvent. In particular, when a film is prepared by coating method, the compounds can be combined with an appropriate binding resin to form a film.

The above-mentioned binding resins can be selected from a wide range of binding resins, such as polyvinylcarbazole resin, polycarbonate resin, polyester resin, polyarylate resin, polystyrene resin, acrylic resin, methacrylic resin, butyral resin, poly(vinyl acetal) resin, diallyl phthalate resin, phenol resin, epoxy resin, silicone resin, polysulfone resin, urea resin, etc., to which the resins are not limited. Moreover, these resins may be used singly, or one or more resins may be mixed with one another to be used as a copolymer.

The anode materials are preferably selected from materials having the greatest work function possible. For example, metal simple substances such as gold, platinum, nickel, palladium, cobalt, selenium, and vanadium, or alloys thereof, metal oxides such as tin oxide, zinc oxide, indium-tin oxide (ITO), and indium-zinc oxide can be used. Furthermore, conductive polymers such as polyaniline, polypyrrole, polythiophene, and polyphenylene sulfide also can be used. These electrode materials may be used singly or in combination with one another.

On the other hand, the cathode materials are preferably selected from materials having a small work function. For example, metal simple substances such as lithium, sodium, potassium, calcium, magnesium, aluminum, indium, silver, lead, tin, and chromium, or alloys of some of these can be used. Metal oxides such as indium-tin oxide (ITO) also can be used. Additionally, the structure of the cathode may be a single layer or multiple layers.

The substrates for use in the present invention are not particularly limited. For example, opaque substrates such as metal substrates and ceramic substrates and transparent substrates such as glass, quartz, and plastic sheet are used. Moreover, emitted lights can be controlled by the use of a color filter film, a fluorescent color conversion filter film, a dielectric reflection film, etc. on a substrate.

Besides, a protection layer or a seal layer may be provided in a prepared device for the purpose of preventing the device from contact with oxygen, moisture, or the like. Examples of the materials for use in the protection layer include inorganic material films such as diamond thin film, metal oxides, and metal nitrides, polymer films such as fluororesin, poly(p-xylene), polyethylene, silicone resin, and polystyrene resin, light-setting resin, etc. Furthermore, the prepared devices themselves can be packaged with appropriate seal resins by means of covering the devices with glass, gas-impermeable films, metals, etc.

EXAMPLES

Hereinafter, the present invention will be specifically explained with reference to the following examples, but the present invention is not limited to these examples.

Example 1

A device having a structure as shown in FIG. 1 was produced.

A transparent conductive supporting substrate was used which was produced by forming a film of indium-tin oxide (ITO) having a film thickness of 120 nm as an anode 2 on a glass substrate as a substrate 1 by means of sputtering method. This substrate was cleaned ultrasonically with acetone and isopropyl alcohol (IPA) in this order. After boiling cleaning with IPA, the substrate was dried. The substrate was further cleaned with UV/ozone and then was used as a transparent conducting supporting substrate.

A solution was prepared by dissolving 0.050 g of the compound shown as the above-exemplified compound No. 1 and 1.00 g of polyvinylcarbazole in 75 ml of tetrahydrofuran. Using this solution, an organic film layer (light-emitting layer 3) having a thickness of 120 nm was formed on a transparent conductive supporting substrate by means of spin coat method (2000 rpm).

Next, using a deposition material composed of aluminum and lithium (having a lithium concentration of 1 atom %), a metal film layer (cathode 4) having a thickness of 150 nm was formed on the above-mentioned organic layer by means of vacuum vapor deposition method. The film formation was performed under the conditions where the degree of vacuum at the time of vapor deposition was $1.0 \times 10^{-4}$ Pa, and the film-forming rate was 1.0 to 1.2 nm per second.

Using an ITO electrode as a positive electrode and an Al—Li electrode as a negative electrode, a direct current voltage of 8 V was applied to the device thus obtained, so that flow of an electric current having a current density of 2.4 mA/cm$^2$ was observed and a red-light emission having an initial brightness of 150 cd/m$^2$ was observed.

Example 2

A device having a structure as shown in FIG. 2 was produced.

A hole-transporting layer 5 was formed by making α-NPD into a thin film having a thickness of 70 nm on a transparent conductive supporting substrate similar to that in Example 1 by means of vacuum vapor deposition method. Subsequently, an electron-transporting layer 6 was formed by making the exemplified compound No. 15 into a thin film having a thickness of 50 nm by means of vacuum vapor deposition method. The film formation was performed under the conditions where the degree of vacuum at the time of vapor deposition was $1.0 \times 10^{-4}$ Pa, and the film-forming rate was 0.2 to 0.3 nm per second.

Next, a cathode 4 was formed on the above-mentioned organic layer in the same manner as in Example 1.

Using an ITO electrode as a positive electrode and an Al—Li electrode as a negative electrode, a direct current voltage of 8 V was applied to the device thus obtained, so that flow of an electric current having a current density of 5.1 mA/cm$^2$ was observed and a red-light emission having an initial brightness of 330 cd/m$^2$ was observed.

Example 3

A device having a structure as shown in FIG. 3 was produced.

A hole-transporting layer 5 was formed by making TPD into a thin film having a thickness of 70 nm on a transparent conductive supporting substrate similar to that in Example 1 by means of vacuum vapor deposition method. A light-emitting layer 3 was formed by making the exemplified compound No. 1 into a thin film having a thickness of 40 nm by means of vacuum vapor deposition method. An electron-transporting layer 6 was formed by making aluminum trisquinolinol into a thin film having a thickness of 25 nm by means of vacuum vapor deposition method. The film formation was performed under the conditions where the degree of vacuum at the time of vapor deposition was $1.0 \times 10^{-4}$ Pa, and the film-forming rate was 0.2 to 0.3 nm per second.

Next, a cathode 4 was formed on the above-mentioned organic layer in the same manner as in Example 1.

Using an ITO electrode as a positive electrode and an Al—Li electrode as a negative electrode, a direct current voltage of 8 V was applied to the device thus obtained, so that flow of an electric current having a current density of 5.4 mA/cm$^2$ was observed and a red-light emission having an initial brightness of 570 cd/m$^2$ was observed.

In addition, a voltage was applied to this device for 1000 hours with the current density kept at 5.0 mA/cm$^2$ under a nitrogen atmosphere. As a result, the initial brightness was 530 cd/m$^2$ and the brightness after 1000 hours was 480 cd/m$^2$. Thus, deterioration in brightness was very small.

Example 4

A device having a structure as shown in FIG. 2 was produced.

A hole-transporting layer 5 was formed by making TPD into a thin film having a thickness of 70 nm on a transparent conductive supporting substrate similar to that in Example 1 by means of vacuum vapor deposition method. Subsequently an electron-transporting layer 6 was formed by making the exemplified compound No. 1 and aluminum trisquinolinol (weight ratio, 1:50) into a thin film having a thickness of 20 nm by means of vacuum vapor deposition method. The film formation was performed under the conditions where the degree of vacuum at the time of the vapor deposition was $1.0 \times 10^{-4}$ Pa, and the film-forming rate was 0.2 to 0.3 nm per second.

Next, a cathode 4 was formed on the above-mentioned organic layer in the same manner as in Example 1.

Using an ITO electrode as a positive electrode and an Al—Li electrode as a negative electrode, a direct current voltage of 8 V was applied to the device thus obtained, so that flow of an electric current having a current density of 5.4 mA/cm$^2$ was observed and a red-light emission having an brightness of 26500 cd/m$^2$ was observed.

In addition, a voltage was applied thereto for 100 hours with the current density kept at 5.0 mA/cm$^2$ under a nitrogen atmosphere. As a result, the initial brightness was 12500 cd/m$^2$ and the brightness after 100 hours was 9600 cd/m$^2$. Thus, deterioration in brightness was very small.

Comparative Example 1

A device was produced in a similar manner as in Example 4 except that the comparative compound represented by the following structural formula (U.S. Pat. No. 5,935,720) was used as the compound for the electron-transporting layer.

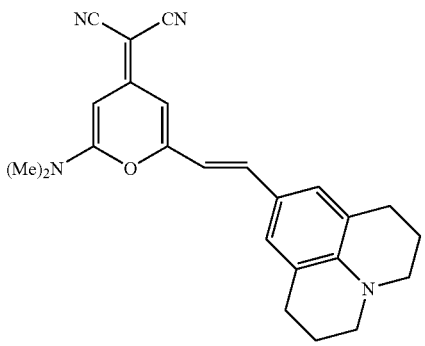

Using an ITO electrode as a positive electrode and an Al—Li electrode as a negative electrode, a direct current voltage of 8 V was applied to the device thus obtained, so that flow of an electric current having a current density of 3.7 mA/cm$^2$ was observed and a red-light emission of 15000 cd/m$^2$ was observed.

In addition, a voltage was applied to this device for 1000 hours with the current density kept at 5.0 mA/cm$^2$ under a nitrogen atmosphere. As a result, the initial brightness was 60 cd/m$^2$ and light emission was not detected after 1000 hours.

INDUSTRIAL APPLICABILITY

As shown in Examples and Comparative Examples, the organic light-emitting devices using the compounds represented by the general formula (1) of the present invention exhibit light emissions with a high brightness in spite of a low applied voltage, and the devices are also excellent in durability.

In particular, an organic layer containing a compound represented by the general formula (1) is useful as an electron-transporting layer and is also useful as a light-emitting layer that emits pure red light.

Moreover, the devices can be produced by the use of vacuum vapor deposition method, casting method or the like. Large-area devices, therefore, can be produced easily at a relatively low cost.

The invention claimed is:

1. An organic light-emitting device comprising a pair of electrodes comprising an anode and a cathode, and one or more layers containing an organic compound, the layers being sandwiched between the pair of the electrodes, wherein at least one layer of the layers containing an organic compound contains a compound represented by the following general formula (1)

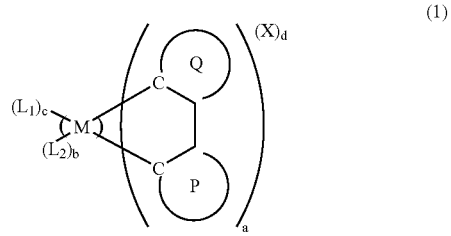

wherein in the formula, M is an iridium atom, P and Q each are a substituted or unsubstituted aromatic hydrocarbon group or a substituted or unsubstituted aromatic heterocyclic group, and P and Q constitute a chelate ligand; P and Q may form a condensed ring with each other; $L_1$ and $L_2$ each are a ligand or an oxygen atom that binds to M by a double bond; and $L_1$ and $L_2$ may form a condensed ring with each other to become a two-coordinate chelate ligand; X represents a counter ion of an anion or a cation; a is an integer of 1 to 3; b and c are each an integer of 0 to 4; and d is an integer of 0 to 3, provided that P, Q, $L_1$, $L_2$, and X each may be the same or different if there are more than one of these.

2. The organic light-emitting device according to claim 1, wherein the iridium atom M is a five-coordinate 16-electron bonding system or a six-coordinate 18-electron bonding system with $L_1$ and $L_2$ and with a chelate ligand comprising P and Q.

* * * * *

UNITED STATES PATENT AND TRADEMARK OFFICE
CERTIFICATE OF CORRECTION

PATENT NO. : 7,232,618 B2
APPLICATION NO. : 10/507476
DATED : June 19, 2007
INVENTOR(S) : Naoki Yamada et al.

Page 1 of 5

It is certified that error appears in the above-identified patent and that said Letters Patent is hereby corrected as shown below:

COLUMN 11:

Line 50, " 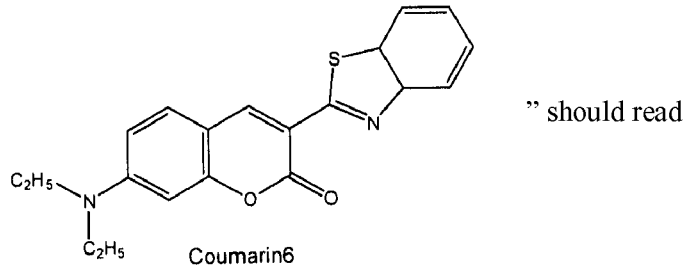 " should read

-- 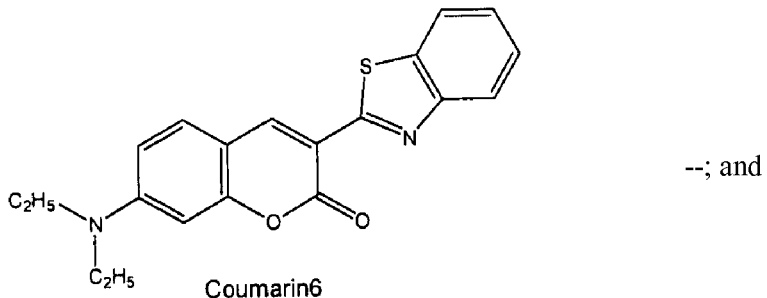 --; and

UNITED STATES PATENT AND TRADEMARK OFFICE
CERTIFICATE OF CORRECTION

PATENT NO.         : 7,232,618 B2
APPLICATION NO. : 10/507476
DATED                  : June 19, 2007
INVENTOR(S)         : Naoki Yamada et al.

It is certified that error appears in the above-identified patent and that said Letters Patent is hereby corrected as shown below:

Line 60, " 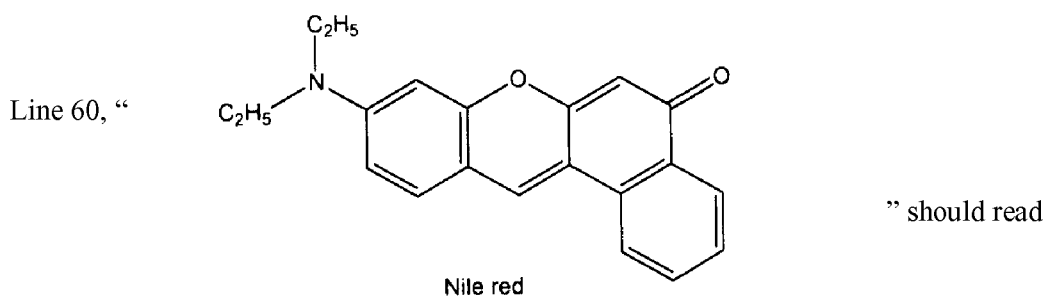 " should read

-- 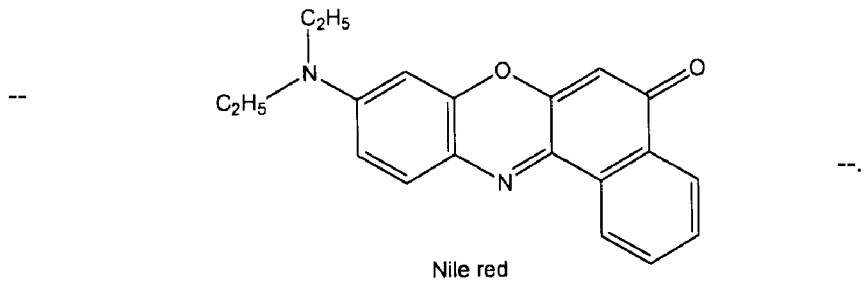 --.

UNITED STATES PATENT AND TRADEMARK OFFICE
CERTIFICATE OF CORRECTION

PATENT NO. : 7,232,618 B2  
APPLICATION NO. : 10/507476  
DATED : June 19, 2007  
INVENTOR(S) : Naoki Yamada et al.

Page 3 of 5

It is certified that error appears in the above-identified patent and that said Letters Patent is hereby corrected as shown below:

Column 17:

Formula, " 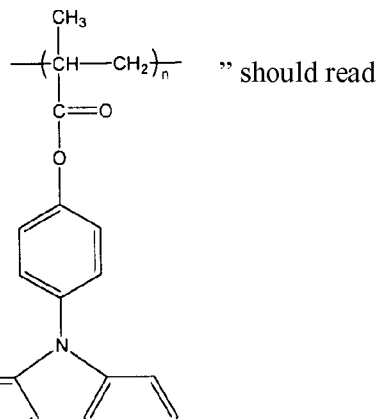 " should read

-- 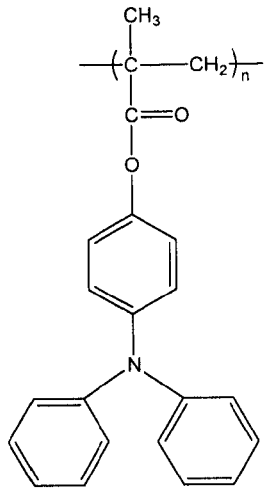 --; and

UNITED STATES PATENT AND TRADEMARK OFFICE
CERTIFICATE OF CORRECTION

PATENT NO. : 7,232,618 B2
APPLICATION NO. : 10/507476
DATED : June 19, 2007
INVENTOR(S) : Naoki Yamada et al.

It is certified that error appears in the above-identified patent and that said Letters Patent is hereby corrected as shown below:

Formula, " 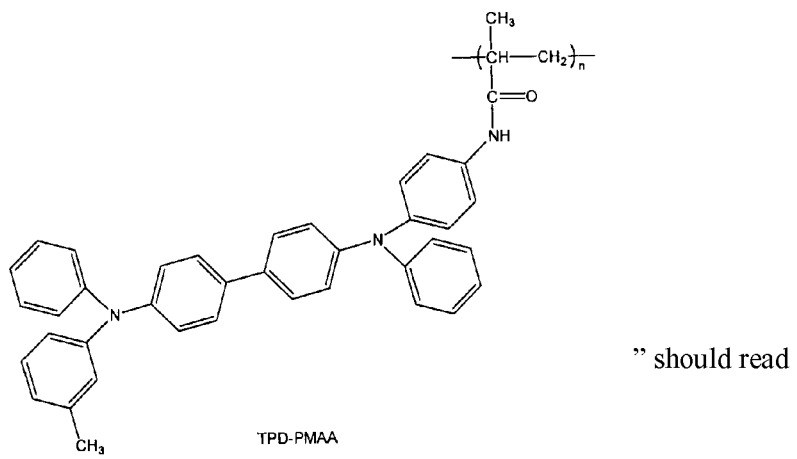 " should read

-- 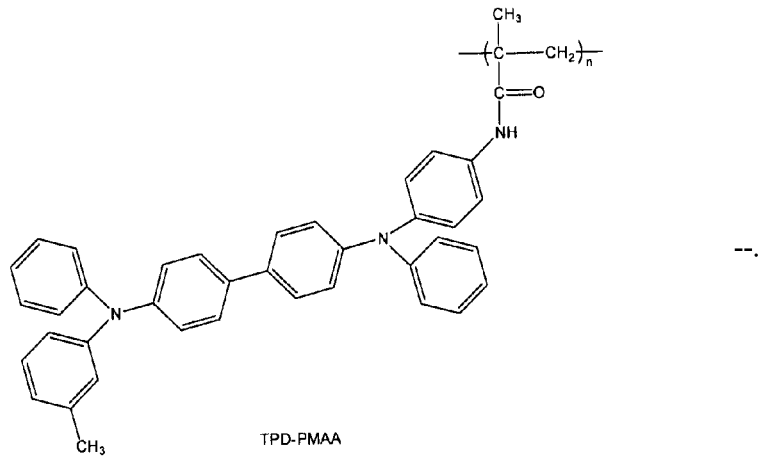 --.

UNITED STATES PATENT AND TRADEMARK OFFICE
CERTIFICATE OF CORRECTION

PATENT NO. : 7,232,618 B2
APPLICATION NO. : 10/507476
DATED : June 19, 2007
INVENTOR(S) : Naoki Yamada et al.

Page 5 of 5

It is certified that error appears in the above-identified patent and that said Letters Patent is hereby corrected as shown below:

COLUMN 18:

Formula, "  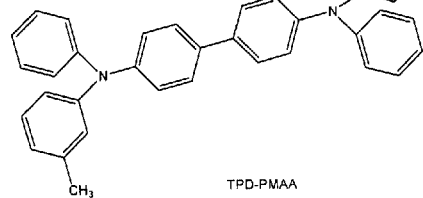 " should read

-- 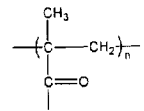 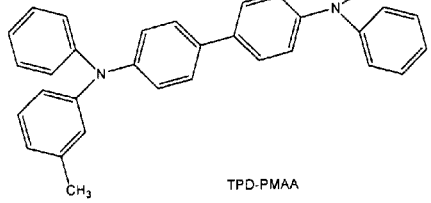 --.

Signed and Sealed this

Third Day of June, 2008

JON W. DUDAS
*Director of the United States Patent and Trademark Office*